(12) United States Patent
Huang

(10) Patent No.: US 12,107,093 B2
(45) Date of Patent: Oct. 1, 2024

(54) ARRAY SUBSTRATE AND MANUFACTURING METHOD THEREOF, AND DISPLAY PANEL

(71) Applicant: Wuhan China Star Optoelectronics Semiconductor Display Technology Co., Ltd., Hubei (CN)

(72) Inventor: Qian Huang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 1088 days.

(21) Appl. No.: 16/966,128

(22) PCT Filed: Mar. 17, 2020

(86) PCT No.: PCT/CN2020/079617
§ 371 (c)(1),
(2) Date: Jul. 30, 2020

(87) PCT Pub. No.: WO2021/114505
PCT Pub. Date: Jun. 17, 2021

(65) Prior Publication Data
US 2023/0178568 A1 Jun. 8, 2023

(30) Foreign Application Priority Data
Dec. 10, 2019 (CN) .......................... 201911258423.2

(51) Int. Cl.
*H01L 27/12* (2006.01)
*H10K 59/12* (2023.01)

(52) U.S. Cl.
CPC ...... *H01L 27/1248* (2013.01); *H01L 27/1259* (2013.01); *H10K 59/12* (2023.02)

(58) Field of Classification Search
CPC ............. H01L 27/1248; H01L 27/1259; H01L 29/41733; H01L 27/1244; H01L 27/1288; H01L 23/5226; H01L 21/76877–76883; H10K 59/12; H10K 59/131; H10K 59/1201; H10K 50/00–88; H10K 71/00–861; H10K 2102/00–361
See application file for complete search history.

(56) References Cited

U.S. PATENT DOCUMENTS

2005/0134756 A1  6/2005  Yang et al.
2011/0017999 A1  1/2011  Choi
(Continued)

FOREIGN PATENT DOCUMENTS

CN    104681631    6/2015
CN    104867921    8/2015
(Continued)

*Primary Examiner* — Shahed Ahmed

(57) ABSTRACT

The present invention provides an array substrate and a manufacturing method thereof, and a display panel. According to the present disclosure, a portion of a surface of an interlayer insulating layer of the array substrate away from a substrate is depressed to form a first groove, a portion of a surface of the first groove near a bottom surface of the substrate is depressed until a surface of an active layer away from the substrate forms a second groove, and the first groove and the second groove are connected with each other to form a through-hole.

10 Claims, 2 Drawing Sheets

(56) References Cited

U.S. PATENT DOCUMENTS

| | | | | |
|---|---|---|---|---|
| 2016/0380115 A1* | 12/2016 | Nakano | ............ | H01L 29/41733 |
| | | | | 257/43 |
| 2021/0013293 A1* | 1/2021 | Hao | ..................... | H10K 59/131 |
| 2021/0027705 A1* | 1/2021 | Huang | ................ | H10K 59/128 |
| 2022/0255025 A1* | 8/2022 | Yang | ................... | H10K 77/111 |

FOREIGN PATENT DOCUMENTS

| | | |
|---|---|---|
| CN | 104952934 | 9/2015 |
| CN | 106847744 | 6/2017 |
| CN | 108091674 | 5/2018 |
| CN | 109817675 | 5/2019 |
| KR | 10-2011-0056899 | 5/2011 |

* cited by examiner

ARRAY SUBSTRATE AND MANUFACTURING METHOD THEREOF, AND DISPLAY PANEL

RELATED APPLICATIONS

This application is a National Phase of PCT Patent Application No. PCT/CN2020/079617 having International filing date of Mar. 17, 2020, which claims the benefit of priority of Chinese Patent Application No. 201911258423.2 filed on Dec. 10, 2019. The contents of the above applications are all incorporated by reference as if fully set forth herein in their entirety.

FIELD AND BACKGROUND OF THE INVENTION

The present disclosure relates to the field of display technology, and more particularly, to an array substrate and a manufacturing method thereof, and a display panel.

Organic light-emitting diodes (OLEDs) are also known as organic electroluminescence display devices, or organic light-emitting semiconductors. A working principle of OLED is that when power is supplied to an appropriate voltage, positive holes and negative electric charge are combined in a light-emitting layer, and under action of Coulomb force, they will recombine to form excitons (electron-hole pair) in an excited state with a certain probability. However, the excited state is unstable in an ordinary environment, and the excitons in the excited state recombine and transfer energy to luminescent materials, causing them to transition from a ground state energy level to the excited state. The excited state energy generates photons, releases light energy, and generates light through a radiation relaxation process, and produces three primary colors of red, green, and blue (RGB) according to different formulas which constitute basic colors.

OLEDs have advantages of low voltage requirements, high power saving efficiency, fast response, light weight, thinness, simple structure, low cost, wide viewing-angles, almost infinitely high contrast, low power consumption, and extremely fast response times, and have become one of the most important display technologies nowadays.

SUMMARY OF THE INVENTION

At present, when a position of a through-hole connected to a source/drain layer and an active layer is usually more than 80 degrees, a breaking risk of side-walls of the source/drain layer climbing is prone to occur. Therefore, a new type of array substrates is provided to solve the above problems.

A purpose of the present disclosure is to provide an array substrate and a manufacturing method thereof, and a display panel to prevent the breaking phenomenon of side-walls of the source/drain layer climbing in the current array substrate.

In order to solve the above problems, an embodiment of the present disclosure provides an array substrate comprising a substrate, an active layer, a gate insulating layer, an interlayer insulating layer, and a source/drain layer. The active layer is disposed on the substrate, the gate insulating layer is disposed on the active layer, the interlayer insulating layer is disposed on the gate insulating layer, the source/drain layer is disposed on the interlayer insulating layer, and source/drain layer is connected to the active layer downward through a through-hole. The through-hole comprises a first groove and a second groove which are connected to each other, a portion of a surface of the interlayer insulating layer away from the substrate is depressed to form the first groove, a portion of a bottom surface of the first groove near the substrate is depressed until a surface of the active layer away from the substrate forms the second groove, and a step is defined at a connecting position between the first groove and the second groove.

Furthermore, the gate insulating layer comprises a first gate insulating layer and a second gate insulating layer, wherein the first gate insulating layer is disposed on the active layer, and the second gate insulating layer is disposed on the first gate insulating layer. The interlayer insulating layer comprises a first interlayer insulating layer and a second interlayer insulating layer, the first interlayer insulating layer is disposed on the second gate insulating layer, and the second interlayer insulating layer is disposed on the first interlayer insulating layer. A portion of a surface of the second interlayer insulating layer away from the substrate is depressed to form the first groove.

Furthermore, a bottom surface of the first groove is defined between the second interlayer insulating layer and the first gate insulating layer.

Furthermore, the bottom surface of the first groove is flush with a surface of the second gate insulating layer away from the substrate.

Another embodiment of the present disclosure further provides a manufacturing method of the array substrate according to the present disclosure. The manufacturing method comprises step S1: providing a substrate and forming an active layer on the substrate; step S2: forming a gate insulating layer on the active layer; step S3: forming an interlayer insulating layer on the gate insulating layer; and step S4: forming a source/drain layer on the interlayer insulating layer, and the source/drain layer is connected to the active layer downward through a through-hole. Wherein, the through-hole in step S4 comprises a first groove and a second groove which are connected to each other, a portion of a surface of the interlayer insulating layer away from the substrate is depressed to form the first groove, and a portion of a bottom surface of the first groove near the substrate is depressed until a surface of the active layer away from the substrate forms the second groove, wherein a step is defined at a connecting position between the first groove and the second groove.

Furthermore, the step S2 comprises forming a first gate insulating layer on the active layer and forming a second gate insulating layer on the first gate insulating layer. The step S3 comprises forming a first interlayer insulating layer on the second gate insulating layer and forming a second interlayer insulating layer on the first interlayer insulating layer. The through-hole in step S4 comprises the first groove and the second groove which are connected to each other, a portion of a surface of the second interlayer insulating layer away from the substrate is depressed to form the first groove, and a portion of a bottom surface of the first groove near the substrate is depressed until a surface of the active layer away from the substrate forms the second groove, wherein a step is defined at a connecting position between the first groove and the second groove.

Furthermore, the through-hole in step S4 comprises the first groove and the second groove which are connected to each other, the first groove is formed by downward etching the surface of the second interlayer insulating layer away from the substrate through a first trepanning hole, and the second groove is formed by etching from a bottom surface of the first groove near the substrate to the surface of the active layer away from the substrate through a second trepanning hole, wherein an overall dimension of the second trepanning hole is less than an overall dimension of the first trepanning hole.

Furthermore, the through-hole in step S4 comprises the first groove and the second groove which are connected to each other, the first groove is formed by downward etching the surface of the second interlayer insulating layer away from the substrate through the second trepanning hole, then the second interlayer insulating layer around the second trepanning hole is etched through the first trepanning hole, and the second groove is formed by etching the surface of the active layer away from the substrate in the second trepanning hole through the first trepanning hole, wherein an overall dimension of the second trepanning hole is less than an overall dimension of the first trepanning hole.

Furthermore, the through-hole in step S4 comprises the first groove and the second groove which are connected to each other, the first groove is formed by downward etching a portion of a surface of the second interlayer insulating layer away from the substrate and processing a hole of photoresist with oxygen, and the second groove is formed by partially etching from the surface of the first groove near a bottom surface of the substrate to the surface of the active layer away from the substrate.

Another embodiment of the present disclosure further provides a display panel comprising the array substrate according to the present disclosure.

The present disclosure provides an array substrate and a manufacturing method thereof, and a display panel. According to the present disclosure, a portion of a surface of the interlayer insulating layer of the array substrate away from the substrate is depressed to form a first groove, a portion of a surface of the first groove near a bottom surface of the substrate is depressed until a surface of an active layer away from the substrate forms a second groove, and the first groove and the second groove are connected with each other to form a through-hole. Therefore, a climbing height of a source/drain layer connected to the active layer through the through-hole is changed, thereby preventing the risk of breaking of the climbing source/drain layer.

BRIEF DESCRIPTION OF THE SEVERAL VIEWS OF THE DRAWINGS

In order to more clearly illustrate the technical solutions of the embodiments of the present invention, the drawings used in the description of the embodiments will be briefly described as below. Obviously, the drawings described as below are just some embodiments of the present invention. For one of ordinary skill in the art, under the premise of no creative labor, other drawings can also be obtained according to these drawings.

Figure 1:
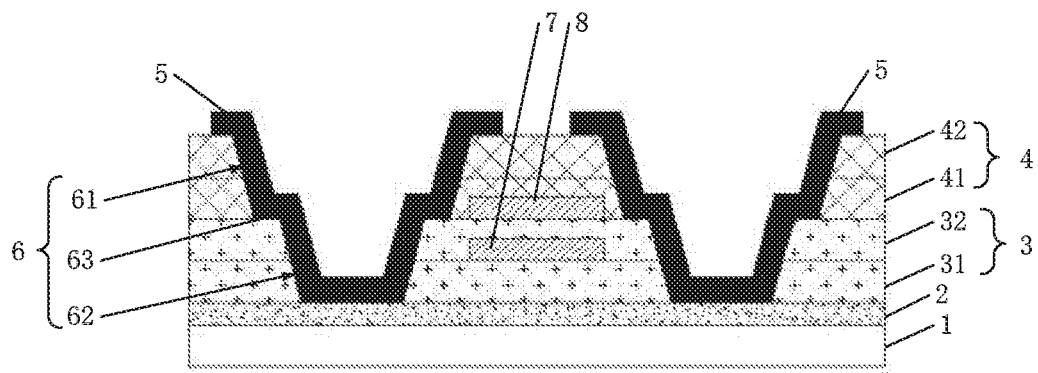
FIG. 1 is a schematic structural diagram of an array substrate of the present disclosure.

Figure numerals: array substrate 100, substrate 1, active layer 2, gate insulating layer 3, interlayer insulating layer 4, first gate insulating layer 31, second gate insulating layer 32, first interlayer insulating layer 41, second interlayer insulating layer 42, source/drain layer 5, through-hole 6, first gate layer 7, second gate layer 8, first groove 61, second groove 62, step 63.

DESCRIPTION OF SPECIFIC EMBODIMENTS OF THE INVENTION

The preferred embodiments of the present disclosure will be described in detail below with reference to the accompanying drawings in order to completely introduce the technical content of the present disclosure to those skilled in the art, to exemplify that the present disclosure can be implemented, to make the disclosed technical content of the present disclosure more clear, and to make it easier for those skilled in the art to understand how to implement the present disclosure. However, the present disclosure can be embodied by many different forms of embodiments. The protection scope of the present disclosure is not limited to the embodiments mentioned in the content, and the description of the following embodiments is not intended to limit the scope of the present disclosure.

The directional terms described by the present disclosure, such as "upper", "lower", "front", "back", "left", "right", "inner", "outer", "side", etc., are only directions by referring to the accompanying drawings. The directional terms used herein are used to explain and explain the present disclosure, rather than to limit the protection scope of the present disclosure.

In figures, elements with same structures are indicated by same numbers, and elements with similar structures or functions are indicated by similar numbers. In addition, in order to facilitate understanding and description, sizes and thickness of each element shown in the drawings are arbitrarily shown, and the present disclosure does not limit the sizes and thickness of each element.

When elements are described as being "on" another element, the element may be disposed directly on the other element; there may also be an intermediate element, the element is disposed on the intermediate element and the intermediate element is disposed on another element. When an element described as "installed to" or "connected to" another element, both can be understood as being directly "installed" or "connected", or one element is "mounted to" or "connected to" another element through an intermediate element.

Embodiment 1

As shown in FIG. 1, an array substrate 100 comprises a substrate 1, an active layer 2, a gate insulating layer 3, an interlayer insulating layer 4, and a source/drain layer 5.

As shown in FIG. 1, the active layer 2 is disposed on the substrate 1.

As shown in FIG. 1, the gate insulating layer 3 is disposed on the active layer 2. Specifically, the gate insulating layer 3 comprises a first gate insulating layer 31 and a second gate insulating layer 32, wherein the first gate insulating layer 31 is disposed on the active layer 2, and the second gate insulating layer 32 is disposed on the first gate insulating layer 31.

As shown in FIG. 1, the interlayer insulating layer 4 is disposed on the gate insulating layer 3. Specifically, the interlayer insulating layer 4 comprises a first interlayer insulating layer 41 and a second interlayer insulating layer 42, wherein the first interlayer insulating layer 41 is disposed on the second gate insulating layer 32, and the second interlayer insulating layer 42 is disposed on the first interlayer insulating layer 41.

As shown in FIG. 1, the array substrate 100 further comprises the source/drain layer 5 disposed on the second interlayer insulating layer 42, wherein the source/drain layer 5 is connected to the active layer 2 through a through-hole 6.

As shown in FIG. 1, the through-hole 6 comprises a first groove 61 and a second groove 62 which are connected to each other, wherein a portion of a surface of the second interlayer insulating layer 42 away from the substrate 1 is depressed to form the first groove 61, a portion of a bottom surface of the first groove 61 near the substrate 1 is depressed until a surface of the active layer 2 away from the substrate 1 to form the second groove 62, and a step 63 is formed at a connecting position between the first groove 61 and the second groove 62.

As shown in FIG. 1, a bottom surface of the first groove 61 is defined between the second interlayer insulating layer 42 and the first gate insulating layer 31. In the present embodiment, the bottom surface of the first groove 61 is flush with a surface of the second gate insulating layer 32 away from the substrate 1. In addition, in the present embodiment, the through-hole 6 comprises the first groove 61 and the second groove 62; in an actual process, it can further comprise a third groove, an fourth groove, etc. In the present embodiment, the through-hole 6 is defined as the first groove 61 and the second groove 62. Therefore, a climbing height of the source/drain layer 5 connected to the active layer 2 through the through-hole 6 is changed, thereby preventing the risk of breaking of the climbing source/drain layer 5 climbing.

As shown in FIG. 1, the array substrate 100 further comprises a first gate layer 7 and a second gate layer 8, wherein the first gate layer 7 is disposed between the first gate insulating layer 31 and the second gate insulating layer 32, and the second gate layer 8 is disposed between the second gate insulating layer 32 and the first interlayer insulating layer 41. The first gate insulating layer 31 mainly prevents the first gate layer 7 and the active layer 2 from contact and avoid being short-circuiting. The second gate insulating layer 32 mainly prevents the first gate layer 7 and the second gate layer 8 from contact and short-circuiting.

Embodiment 2

Figure 2:
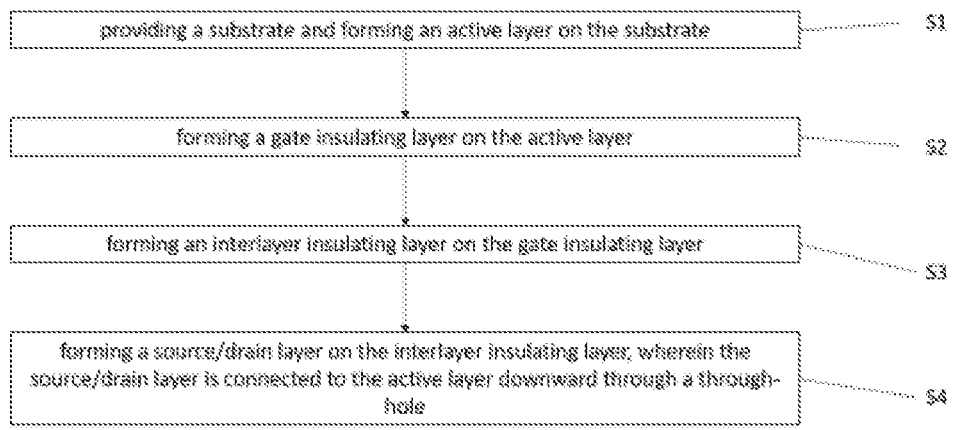
FIG. 2 is a second schematic structural diagram of an array substrate of the present disclosure.

As shown in FIG. 2, the present disclosure further provides a manufacturing method of the array substrate 100 according to the present disclosure. The manufacturing method comprises step S1: providing a substrate 1 and forming an active layer 2 on the substrate 1; step S2: forming a gate insulating layer 3 on the active layer 2; step S3: forming an interlayer insulating layer 4 on the gate insulating layer 3; and step S4: forming a source/drain layer 5 on the interlayer insulating layer 4, and the source/drain layer 5 is connected to the active layer 2 downward through a through-hole 6. Wherein, the through-hole 6 in step S4 comprises a first groove 61 and a second groove 62 which are connected to each other, a portion of a surface of the interlayer insulating layer 4 away from the substrate 1 is depressed to form the first groove 61, a portion of a bottom surface of the first groove 61 near the substrate 1 is depressed until a surface of the active layer 2 away from the substrate 1 forms the second groove 62, and a step 63 is formed at a connecting position between the first groove 61 and the second groove 62.

Specifically, the step S2 comprises forming a first gate insulating layer 31 on the active layer 2 and forming a second gate insulating layer 32 on the first gate insulating layer 31. The step S3 comprises forming a first interlayer insulating layer 41 on the second gate insulating layer 32 and forming a second interlayer insulating layer 42 on the first interlayer insulating layer 41. The through-hole 6 in step S4 comprises the first groove 61 and the second groove 62 which are connected to each other. A portion of a surface of the second interlayer insulating layer 42 away from the substrate 1 is depressed to form the first groove 61, a portion of a bottom surface of the first groove 61 near the substrate 1 is depressed until a surface of the active layer 2 away from the substrate 1 forms the second groove 62, wherein the step 63 is formed at a connecting position between the first groove 61 and the second groove 62.

Embodiment 3

Figure 3:
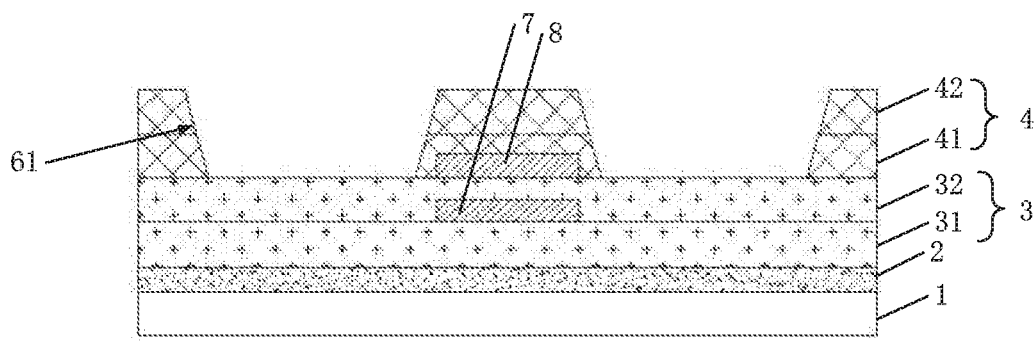
FIG. 3 is a schematic structural diagram of an embodiment 3 of the present disclosure.

The through-hole 6 in step S4 comprises the first groove 61 and the second groove 62 which are connected to each other. As shown in FIG. 3, the first groove 61 is formed by downward etching the surface of the second interlayer insulating layer 42 away from the substrate 1 through a first trepanning hole. As shown in FIG. 1, the second groove 62 is formed by etching from the bottom surface of the first groove 61 near the substrate 1 to the surface of the active layer 2 away from the substrate 1 through a second trepanning hole. Wherein, an overall dimension of the second trepanning hole is less than an overall dimension of the first trepanning hole. Therefore, the through-hole 6 is defined as the first groove 61 and the second groove 62, and a climbing height of the source/drain layer 5 connected to the active layer 2 through the through-hole 6 is changed, thereby preventing the risk of breaking of the climbing source/drain layer 5.

Embodiment 4

Figure 4:
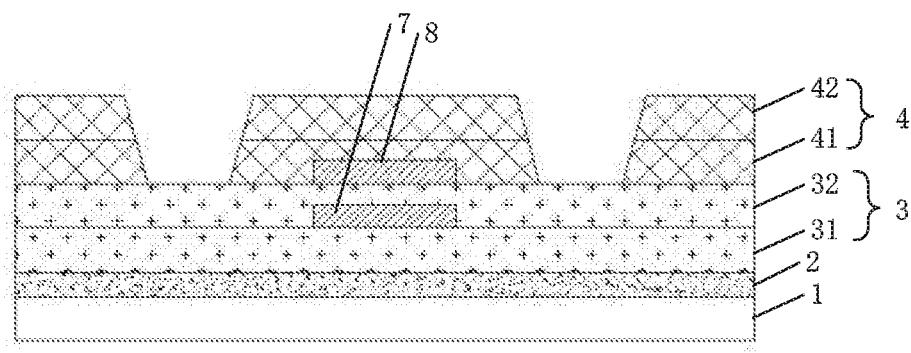
FIG. 4 is a schematic structural diagram of an embodiment 4 of the present disclosure.

The through-hole in step S4 comprises the first groove 61 and the second groove 62 which are connected to each other. As shown in FIG. 4, downward etching a surface of the second interlayer insulating layer 42 away from the substrate 1 through the second trepanning hole, and as shown in FIG. 1, etching the second interlayer insulating layer around the second trepanning hole through the first trepanning hole to form the first groove 61, simultaneously etching the surface of the active layer away from the substrate in the second trepanning hole through the first trepanning hole to form the second groove. Wherein, an overall dimension of the second trepanning hole is less than an overall dimension of the first trepanning hole. Therefore, the through-hole 6 is defined as the first groove 61 and the second groove 62, and a climbing height of the source/drain layer 5 connected to the active layer 2 through the through-hole 6 is changed, thereby preventing the risk of breaking of the climbing source/drain layer 5.

Embodiment 5

In step S4, downward etching a portion of a surface of the second interlayer insulating layer 42 away from the substrate 1 and processing a hole of photoresist with oxygen to form the first groove 61. Partially etching from a surface of the first groove 61 near a bottom surface of the substrate 1 to the surface of the active layer 2 away from the substrate 1 to form the second groove 62. Therefore, a climbing height of the source/drain layer 5 connected to the active layer 2 through the through-hole 6 is changed, thereby preventing the risk of breaking of the climbing source/drain layer 5. The manufacturing steps of the first groove 61 in the present embodiment are similar to FIG. 4, and the manufacturing steps of the second groove 62 in the present embodiment are similar to FIG. 1, so it is not repeated herein.

The array substrate, a manufacturing method thereof, and a display panel provided by the present disclosure have been described in detail above. It should be understood that the exemplary embodiments described herein should be considered only descriptive and are used to help understand method of the present disclosure and its core ideas, but not to limit the present disclosure. Descriptions of features or aspects in each exemplary embodiment should typically be considered as applicable to similar features or aspects in other exemplary embodiments. Although the present disclosure has been described with reference to exemplary embodiments, various changes and modifications may be suggested to those skilled in the art. The present disclosure is intended to cover these changes and modifications within a scope of appended claims. Any modification, equivalent replacement, and improvement made within spirit and principle of the present disclosure shall be included in a protection scope of the present disclosure.

What is claimed is:

1. An array substrate, comprising:
   a substrate;
   an active layer disposed on the substrate;
   a gate insulating layer disposed on the active layer, wherein the gate insulating layer comprises a first gate insulating layer disposed on the active layer, and a second gate insulating layer disposed on the first gate insulating layer;
   an interlayer insulating layer disposed on the gate insulating layer, wherein the interlayer insulating layer comprises a first interlayer insulating layer disposed on the second gate insulating layer, and a second interlayer insulating layer disposed on the first interlayer insulating layer; and
   a source/drain layer disposed on the interlayer insulating layer and connected to the active layer downward through a through-hole,
   wherein the through-hole comprises a first groove and a second groove which are connected to each other;
   a portion of a surface of the second interlayer insulating layer away from the substrate is depressed to form the first groove;
   a portion of a bottom surface of the first groove near the substrate is depressed until a surface of the active layer away from the substrate to form the second groove; and
   a step is defined at a connecting position between the first groove and the second groove.

2. The array substrate as claimed in claim 1, wherein the bottom surface of the first groove is defined between the second interlayer insulating layer and the first gate insulating layer.

3. The array substrate as claimed in claim 2, wherein the bottom surface of the first groove is flush with a surface of the second gate insulating layer away from the substrate.

4. A method of manufacturing the array substrate as claimed in claim 1, comprising:
   providing the substrate and forming the active layer on the substrate;
   forming the first gate insulating layer on the active layer;
   forming the second gate insulating layer on the first gate insulating layer;
   forming the first interlayer insulating layer on the second gate insulating layer;
   forming the second interlayer insulating layer on the first interlayer insulating layer; and
   forming the source/drain layer on the second interlayer insulating layer, wherein the source/drain layer is connected to the active layer downward through the through-hole,
   wherein the through-hole comprises the first groove and the second groove which are connected to each other;
   the portion of the surface of the second interlayer insulating layer away from the substrate is depressed to form the first groove;
   the portion of the bottom surface of the first groove near the substrate is depressed until the surface of the active layer away from the substrate to form the second groove; and
   the step is defined at the connecting position between the first groove and the second groove.

5. The method as claimed in claim 4, wherein
   the first groove is formed by etching downward from the surface of the second interlayer insulating layer away from the substrate through a first trepanning hole;
   the second groove is formed by etching from the bottom surface of the first groove near the substrate to the surface of the active layer away from the substrate through a second trepanning hole; and
   an overall dimension of the second trepanning hole is less than an overall dimension of the first trepanning hole.

6. The method as claimed in claim 4, wherein
   the first groove is formed by etching downward from the surface of the second interlayer insulating layer away from the substrate through a second trepanning hole and etching a portion of the second interlayer insulating layer around the second trepanning hole through a first trepanning hole;
   the second groove is formed by etching until the surface of the active layer away from the substrate through the first trepanning hole; and
   an overall dimension of the second trepanning hole is less than an overall dimension of the first trepanning hole.

7. The method as claimed in claim 4, wherein
   the first groove is formed by etching downward the portion of the surface of the second interlayer insulating layer away from the substrate and processing a hole of photoresist with oxygen; and
   the second groove is formed by partially etching from the bottom surface of the first groove near the substrate to the surface of the active layer away from the substrate.

8. A display panel, comprising the array substrate as claimed in claim 1, wherein the array substrate comprises:
   the substrate;
   the active layer disposed on the substrate;
   the gate insulating layer disposed on the active layer, wherein the gate insulating layer comprises the first gate insulating layer disposed on the active layer and the second gate insulating layer disposed on the first gate insulating layer;
   the interlayer insulating layer disposed on the gate insulating layer, wherein the interlayer insulating layer comprises the first interlayer insulating layer disposed on the second gate insulating layer and the second interlayer insulating layer disposed on the first interlayer insulating layer; and
   the source/drain layer disposed on the interlayer insulating layer and connected to the active layer downward through the through-hole;

wherein the through-hole comprises the first groove and the second groove which are connected to each other;

the portion of the surface of the second interlayer insulating layer away from the substrate is depressed to form the first groove;

the portion of the bottom surface of the first groove near the substrate is depressed until the surface of the active layer away from the substrate to form the second groove; and the step is defined at the connecting position between the first groove and the second groove.

9. The display panel as claimed in claim 8, wherein the bottom surface of the first groove is defined between the second interlayer insulating layer and the first gate insulating layer.

10. The display panel as claimed in claim 9, wherein the bottom surface of the first groove is flush with a surface of the second gate insulating layer away from the substrate.

* * * * *